United States Patent [19]

Nawrocki et al.

[11] Patent Number: 4,527,156
[45] Date of Patent: Jul. 2, 1985

[54] DIGITAL PROCESSING AND COMPARISON DEVICE

[75] Inventors: Nicholas F. Nawrocki; Matt R. Dodson, both of Toledo, Ohio

[73] Assignee: Helm Instrument Company, Inc., Maumee, Ohio

[21] Appl. No.: 543,219

[22] Filed: Oct. 19, 1983

Related U.S. Application Data

[63] Continuation of Ser. No. 273,329, Jun. 15, 1981, abandoned.

[51] Int. Cl.³ ............................................. G09G 3/00
[52] U.S. Cl. .................................. 340/753; 340/754; 340/782; 350/131
[58] Field of Search ............ 340/753, 754; 324/99 R, 324/99 D, 131, 132

[56] References Cited

U.S. PATENT DOCUMENTS

| | | | |
|---|---|---|---|
| 2,497,961 | 2/1950 | Shaw | 324/131 |
| 3,525,091 | 8/1970 | Lally | 340/753 |
| 3,684,870 | 8/1972 | Nelson | |
| 3,772,874 | 11/1973 | Lefkowitz | |
| 3,914,758 | 10/1975 | Ingle | 340/753 |
| 3,961,256 | 6/1976 | Gaskell et al. | |
| 4,009,414 | 2/1977 | Bockett-Pugh | 340/753 |
| 4,199,758 | 4/1980 | Wilhelm et al. | 340/753 |
| 4,212,009 | 7/1980 | Adleman | 340/728 |
| 4,247,855 | 1/1981 | Uede et al. | 340/753 |

Primary Examiner—Marshall M. Curtis
Attorney, Agent, or Firm—Fraser & Clemens

[57] ABSTRACT

A digital processing and comparison indicating apparatus is responsive to an input signal having a value proportional to the quantity to be indicated for displaying a quantity of electrical information in an analog form of decimal notation. A microprocessor compares the value of the input signal with a first plurality of reference values and generates decade enable signals for each one of the first reference values which are less than or equal to the input signal value. The microprocessor also compares the input signal value with a second plurality of reference values and generates units enable signals for each one of the second reference values which are less than or equal to the difference between the input signal value and the value of the largest one of the first reference values for which first enable signals have been generated. The decade and units enable signals drive a display which typically includes a plurality of light emitting diodes for indicating the quantity of the electrical information. This display can have the decades indicating LEDs positioned in a semi-circle or circle and the units indicating LEDs positioned in a straight line for improved readability.

1 Claim, 6 Drawing Figures

DIGITAL PROCESSING AND COMPARISON DEVICE

This is a continuation of Ser. No. 273,329, filed June 15, 1981, now abandoned.

BACKGROUND OF THE INVENTION

1. Field of the Invention

The present invention relates in general to an apparatus for displaying sensed electrical information and in particular to a solid state indicator for displaying electrical information in an analog form of decimal notation.

2. Description of the Prior Art

The two basic means for displaying electrical information are the electro-mechanical meter and the solid state display. In the electro-mechanical meter, the electrical energy is converted into the movement of a mechanical pointer across a meter face carrying indicia of the quantity being displayed. In the solid state display, an analog-to-digital conversion takes place to generate drive signals to activate segments of the display to form letters, numbers and symbols. These segments can be in the form of gas discharge tubes, liquid crystals, light emitting diodes, etc.

One form of prior art solid state display is a light bar comprised of a plurality of individual display segments arranged in a straight line. Each segment represents one predetermined portion of the total display, such as one percent. Each segment is driven from a comparator which compares the input signal level with a reference voltage from a voltage divider. Such a device has the disadvantages of being difficult to read from a distance and requiring a large number of segments for reasonable resolution.

Another solid state indicating device is disclosed in U.S. Pat. No. 4,199,758 issued to Wilhelm et al. In this indicating device, a plurality of LEDs representing the decades information are positioned in a semi-circle and a second plurality of LEDs representing the units information are positioned in a straight line. Such an arrangement results in improved readability. However, the Wilhelm et al. device utilizes discrete electronic components which results in increased costs and relatively extensive circuit calibrations.

SUMMARY OF THE INVENTION

The present invention concerns a microprocessor-based solid state indicating apparatus which is easy to read and has a minimum number of individual indicators. The apparatus is responsive to an input signal for indicating a quantity of electrical information in decimal notation wherein the input signal has a voltage level which is proportional to the quantity to be indicated. An analog-to-digital converter is responsive to the analog input signal for generating a digital output signal. The digital output signal is supplied to a microprocessor through a peripheral interface adapter. The microprocessor decodes the digital information in order to select which portion of the decade LEDs and which portion of the unit LEDs are to be lit. The microprocessor then generates enable signals through the interface adapter to light the selected LEDs.

The decade LEDs can be arranged in a semi-circle or circle in ascending order and the units LEDs can be arranged in a straight line inside the semi-circle or circle. The units LEDs cycle between lighting of adjacent decade LEDs as the input signal voltage level varies, with all LEDs at or below the indicated voltage level being turned on for ease of reading the quantity being indicated. Polarity indicators can also be included.

It is an object of the present invention to provide a display device which reduces the complexity of devices for indicating electrical information.

It is another object of the present invention to provide a display device which decreases the difficulty in reading visual indicators of the type employing individual indicators for portions of the quantity being indicated.

DESCRIPTION OF THE PREFERRED EMBODIMENT

Figure 1:
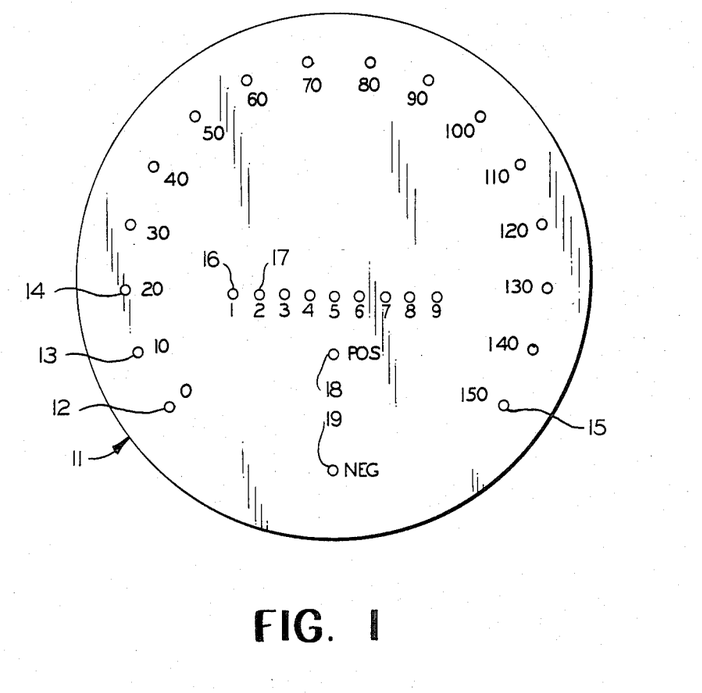
FIG. 1 is a view of a visual display device according to the present invention.

There is shown in FIG. 1 a display means 11 according the present invention for visually indicating a quantity of electrical information. A plurality of decade indicators are positioned along an arc of a circular path such as a "0" indicator 12, a "10" indicator 13, a "20" indicator 14, and a "150" indicator 15. A plurality of units indicators are positioned along a straight line path inside the arc of decade indicators such as a "1" indicator 16 and a "2" indicator 17. If the quantities to be displayed can have either a positive or a negative polarity, a pair of polarity indicators are provided such as a positive polarity indicator 18 and a negative polarity indicator 19.

The quantity of electrical information to be indicated is represented as an input signal having a voltage level porportional to the quantity. The indicia adjacent the units and decade indicators can represent, for example, volts or amperes or percent of a standard reference quantity. The units and decades indicators representing the quantity will be lighted as will be all the decades indicators representing voltage levels below the voltage level of the input signal. Thus, for an input signal voltage level of seventy-five, all decade indicators from "0" through "70" will be lighted to define an arc and all units indicators from "1" through "5" will be lighted to define a straight line, which arc and straight line are easily distinguishable even from a substantial distance.

Figure 2:
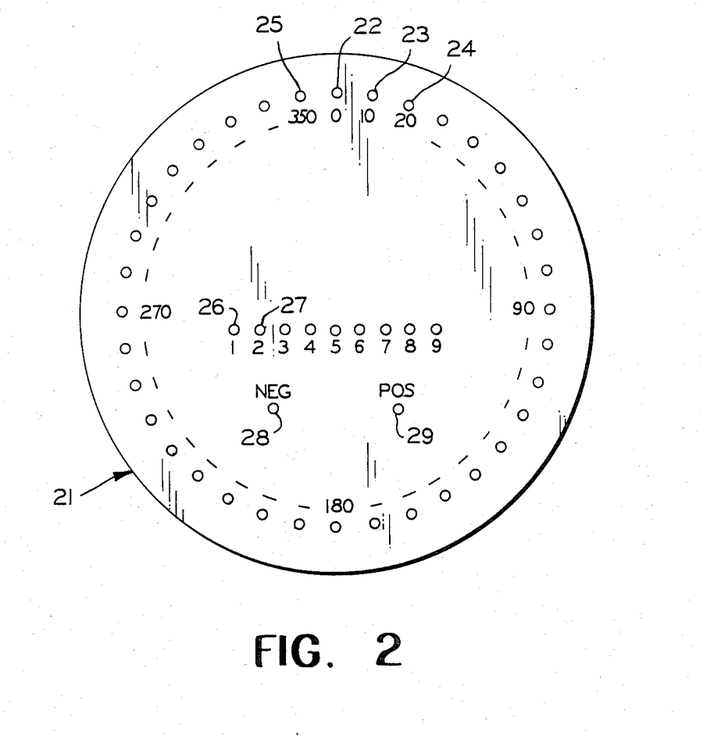
FIG. 2 is a view of an alternate embodiment of a visual display device according to the present invention.

There is shown in FIG. 2 an alternate embodiment of a display means 21 according to the present invention. In this display means, a plurality of decade indicators are positioned in a circular path such as a "0" indicator 22, a "10" indicator 23, a "20" indicator 24, up through a "350" indicator 25. In order to simplify the drawings, the indicia associated with a portion of the decade of units indicators are represented by a dashed arc. A plurality of units indicators are positioned along a straight line path inside the circle of decade indicators such as a "1" indicator 26 and a "2" indicator 27. As was the case for the display means of FIG. 1, a negative polarity indicator 28 and a positive polarity indicator 29 are provided to distinguish between a positive and a negative polarity quantity. Although the display means 21 of FIG. 2 can be utilized for the same applications as the display means 11 of FIG. 1, it is especially advantageous for use in cases where it is desired to display a position of a rotating mechanical element in terms of angular degrees. In these instances, it is typically not necessary to provide either of the polarity indicators 28 and 29 for the purpose of indicating the angular position of the element. However, in some instances, it may be desirous to utilize the polarity indicators as clockwise or counterclockwise indicators to indicate the direction of rotation of the element.

Figure 3:
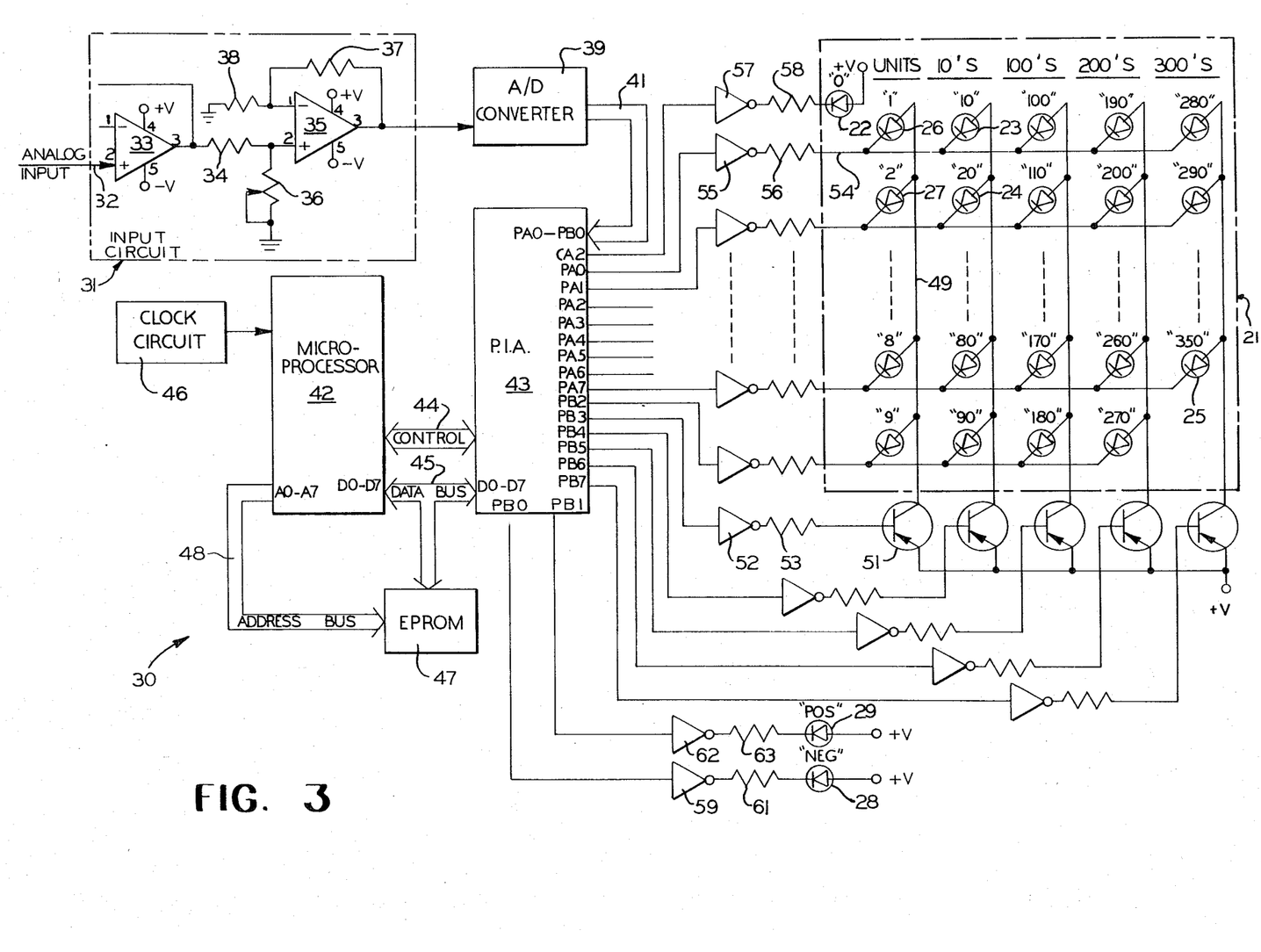
FIG. 3 is a schematic diagram of a circuit for generating a visual display of electrical information according to the present invention.

There is shown in FIG. 3 a schematic diagram of a circuit 30 according to the present invention for indicating a quantity of electrical information. Although the circuit 30 will be described in conjunction with the display means 22 of FIG. 2, it will become readily apparent to one skilled in the art that the circuit can be adapted for use with the display means 11 of FIG. 1. The input signal having a voltage level porportional to the quantity is applied to an input circuit 31 on an input line 32 connected to a non-inverting input 33-2 of an operational amplifier 33. The operational amplifier 33 has an inverting input 33-1 connected to an output 33-3. A pair of power supply inputs 33-4 and 33-5 are connected to a +V potential and a −V potential, respectively, of the circuit power supply (not shown). The operational amplifier 33 is connected to function as a voltage follower and has unity gain, high input impedance, and low output impedance to function as an isolater between the input signal source (not shown) and the remainder of the circuit 30.

The amplifier output 33-3 is connected through a resistor 34 to a non-inverting input 35-2 of an operational amplifier 35. The non-inverting input 35-2 is connected to one fixed terminal of a potentiometer 36 having its variable terminal and other fixed terminal connected to the circuit ground potential. A resistor 37 is connected between an inverting input 35-1 and an output 35-3 while another resistor 38 is connected between the input 35-1 and the ground potential. A pair of power supply inputs 35-4 and 35-5 are connected to the +V potential and the −V potential, respectively. The amplifier output 35-3 is connected to an input of an analog-to-digital (A/D) converter 39. The amplifier 35 and its associated circuitry function to scale the input signal to a level suitable for conversion by the A/D converter 39. This level is adjustable by means of the potentiometer 36.

The A/D converter 39 transforms the analog signal at its input to a digital output signal on a plurality of lines 41 and supplies the digital signal to a microprocessor 42 through a priority interface adapter (PIA) 43. Specifically, the output lines 41 of the A/D converter 39 are connected to port terminals PA0 through PB0 of the PIA 43. When the appropriate control signals are generated by the microprocessor 42 on a control bus 44, the PIA 43 will pass the signals present at terminals PA0 to PB0 to the microprocessor 42 on a data bus 45. The data bus 45 is connected between the D0 through D7 terminals of the microprocessor 42 and the PIA 43.

The microprocessor 42 can be a Model No. MC6802 and the PIA 43 can be a Model No. MC6821, both of which are manufactured by Motorola, Inc. The PIA 43 functions to expand the input/output capabilities of the microprocessor 42. Depending upon the types of control signals generated on the control bus 44, the port terminals PA0 through PA7 and PB0 through PB7 of the PIA 43 can be used as either inputs or outputs.

The microprocessor 42 is connected to receive a clock signal from a clock circuit 46. The clock signal controls the speed at which the microprocessor 42 executes the program instructions. The control program for the microprocessor 42 is stored in erasable, programmable read only memory (EPROM) 47. The microprocessor 42 reads the program instructions via the data bus 45 by generating the appropriate address signals on an address bus 48.

In addition to supplying the digital output signal of the A/D converter 39 to the microprocessor 42, the PIA 43 is also utilized to supply the respective enable signals to the various visual indicators. In FIG. 3, the display means 21 of FIG. 2 is represented by a plurality of light emitting diodes (LEDs) which are arranged in a row and column array in order to simplify the schematic.

The LED array of FIG. 3 includes five separate groups arranged in individual columns, plus the "0" LED 22, the "NEG" LED 28, and the "POS" LED 29. The five groups include the column of "UNITS" indicators comprising the "1" LED through the "9" LED, the "10's" indicators comprising the "10" LED through the "90" LED, the "100's" indicators comprising the "100" LED through the "180" LED, the "200's" indicators comprising the "190" LED through the "270" LED, and the "300's" indicators comprising the "280" LED through the "350" LED.

The anodes of each group of LEDs are connected to a common line which in turn is connected to a collector of an NPN transistor having an emitter connected to the +V potential. For example, the "1" LED 26 and the "2" LED 27 both have anodes connected to a common line 49 which is connected to the collector of an NPN transistor 51. The base of the transistor 51 is connected to receive an enable signal from the PB3 terminal of the PIA 43 through an inverter 52 and a resistor 53. The anodes of each of the other groups of LEDs are connected to receive the enable signals by a similar inverter, resistor and transistor arrangement.

The cathodes of one diode in each group are connected to a common line which in turn is connected to receive an enable signal from the PIA 43 through an inverter and resistor arrangement. For example, the "1" LED 26 and the "10" LED 23 have anodes connected to a common line 54 to receive an enable signal from the PA0 terminal of the PIA 43 through an inverter 55 and a resistor 56. The anodes of the other LEDs in the five groups are connected to receive enable signals in a similar manner.

The "0" LED 22 has a cathode connected to receive an enable signal from the CA2 control terminal through an inverter 57 and a resistor 58. The anode of the "0" LED 22 is connected to the +V potential. The "NEG" LED 28 has a cathode connected to receive an enable signal from the PB0 terminal through an inverter 59 and a resistor 61. The "POS" LED 29 has a cathode connected to receive an enable signal from the PB1 terminal through an inverter 62 and a resistor 63. The anodes of both the "NEG" LED 28 and the "POS" LED 29 are connected to the +V potential.

The microprocessor 42 can selectively turn on any of the LEDs by generating the appropriate enable signals at the output terminals of the PIA 43. For example, the "1" LED 26 can be turned on by generating a logic "1"

near the +V potential at the PA0 terminal to pull the line 54 to near ground potential, while simultaneously generating a logic "1" at the PB3 terminal to turn on the transistor 51 and apply the +V potential to the line 49. This will forward bias the "1" LED 26 and cause the LED to light. Thus, by causing one of the row lines to pull to ground and applying a +V potential to a column line, the LED associated with both lines will be forward biased and will light. The "0" LED 22, the "NEG" LED 28, and the "POS" LED 29 can be turned on by generating a logic "1" at the respective PIA output terminal.

As previously mentioned, the units and decades LEDs representing the input quantity will be lighted as will all the decades and units LEDs representing values less than the input quantity. The microprocessor 42 utilizes a multiplexing output routine to simultaneously light the selected LEDs. The microprocessor 42 can sequentially generate enable signals for each column to simultaneously turn on the selected LEDs in each column. For example, the microprocessor 42 can first generate enable signals to light the selected "UNITS" LEDs by pulling the appropriate row lines to ground while simultaneously turning on the transistor 51 to set the column line 49 to a +V potential. After the "UNITS" LEDs have been lit, the microprocessor 42 will discontinue generating the units enable signals and generate the enable signals required to turn on the selected "10's" LEDs. The microprocessor will then sequentially turn on the "100's", the "200's", and the "300's" LEDs in a similar manner to complete the multiplexing cycle. The microprocessor will continue to repeat the multiplexing cycle, while updating the displayed quantity as the input quantity varies.

Although each of the selected LEDs will only be turned on for a portion of the multiplexing cycle, the speed at which the cycle is performed is sufficiently fast such that the selected LEDs will appear to be continuously lit to an operator. This type of multiplexing routine simplfies the electronics required to drive LED indicators. The multiplexing routine also permits the use of a smaller +V power supply, since the largest number of LEDs which are turned on at any one time corresponds to the number of LEDs in each column.

Figure 4A:
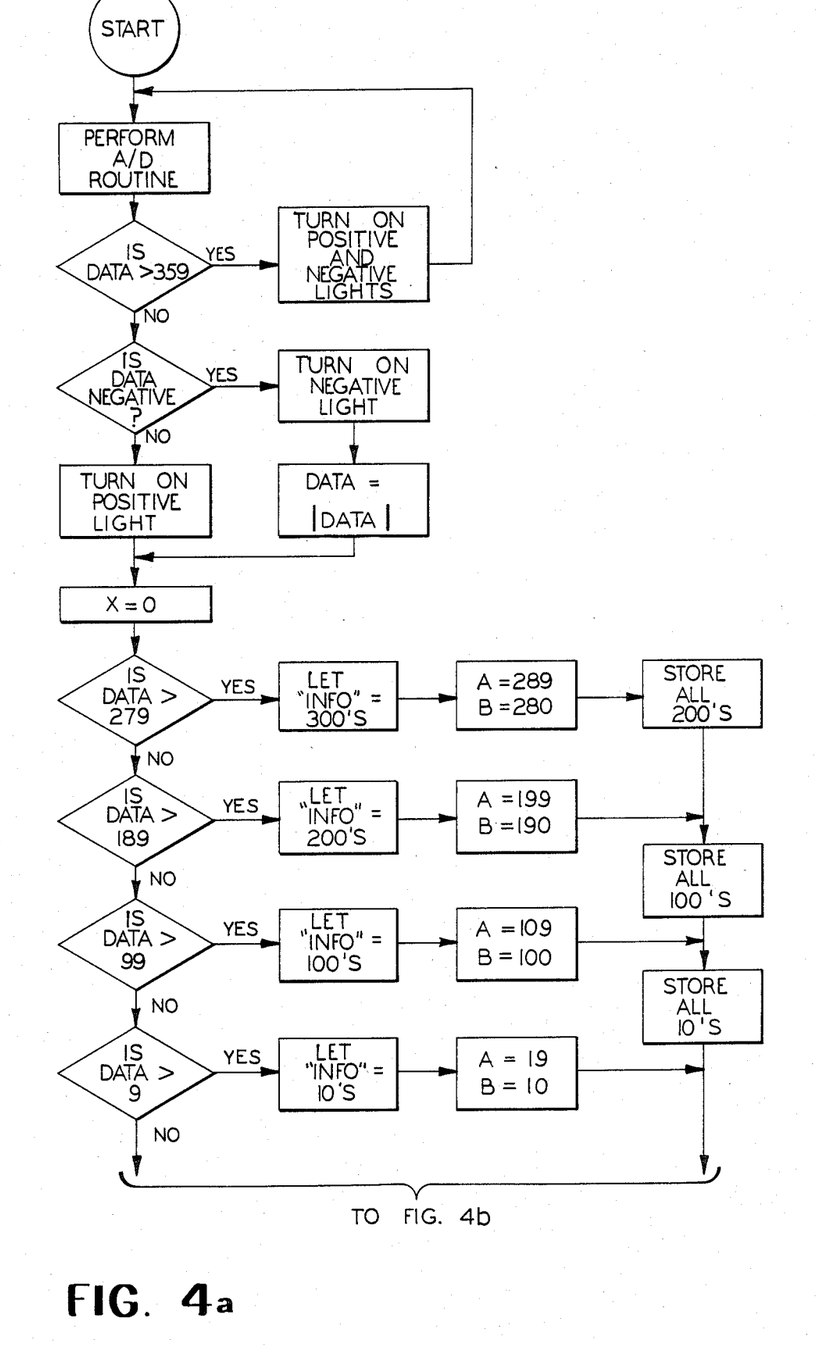
FIGS. 4a and 4b are simplified flow diagrams illustrating the operation of the microprocessor in the circuit of FIG. 3.
Figure 4B:
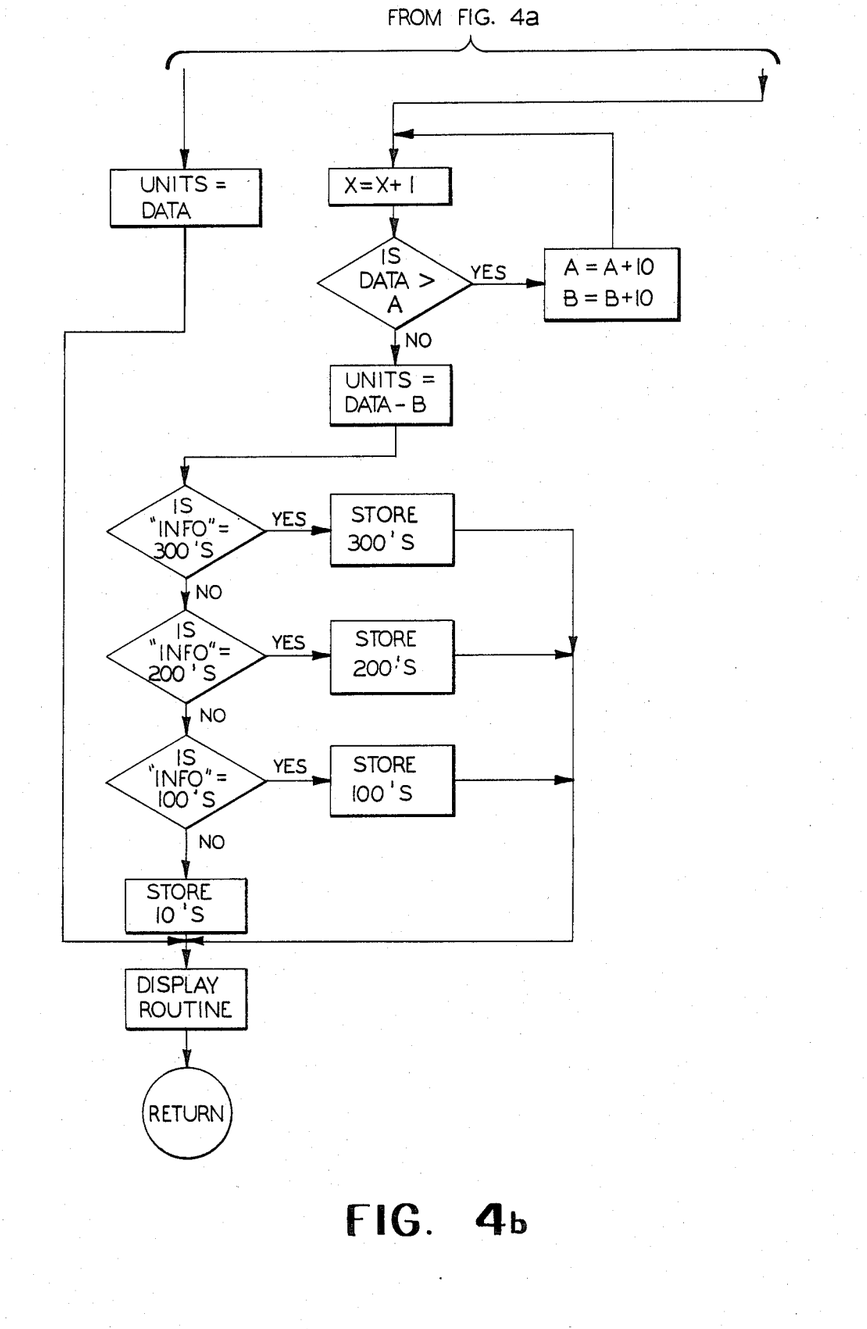

There is shown in FIGS. 4a and 4b a flow diagram illustrating the operation of the microprocessor 42 in determining which ones of the LED indicators are to be lit. The program is initiated at a circle START and then enters a processing function PERFORM A/D ROUTINE. At this time, the microprocessor 42 generates the appropriate control signals on the control bus 44 to read the output of the A/D converter 39 on the lines 41. This output signal is then supplied to the microprocessor by the PIA 43 via the data bus 45. After the A/D converter has been read, the program enters a decision point IS DATA>359. If the data is greater than 359, the program exits the decision point at YES and enters a processing function TURN ON POSITIVE AND NEGATIVE LIGHTS. Here, the microprocessor generates logic "1" enable signals at the PB0 and PB1 output terminals of the PIA 43 to light both the "NEG" LED 28 and the "POS" LED 29 respectively. This informs the operator that data which has been read is outside the expected range of data. The microprocessor will continue to perform the A/D routine until the data value falls in the expected range.

If the data is not greater than 359, the program exits the decision point IS DATA>359 at NO and enters a decision point IS DATA NEGATIVE? If the data is not negative, the program exits the decision point at NO and enters a processing function TURN ON POSITIVE LIGHT to turn on the "POS" LED 29 to inform the operator that the data which has been read is positive. If the data is negative, the program exits the decision point at YES and enters a processing function TURN ON NEGATIVE LIGHT. After the "NEG" LED 28 has been turned on, the program enters a processing function DATA=|DATA|. This converts the negative data value to an absolute value which, read in conjunction with the lighted "NEG" LED 28 represents the true data value.

After turning on either the "POS" or the "NEG" LED, the program enters processing function X=0 wherein the variable X is set equal to the value zero. The purpose of the variable X will be discussed hereinafter. Next, the program will execute a series of decision points in order to determine in which one of the four possible LED groups the decades data value is located. The program first enters a decision point IS DATA>279. If the data value is greater than 279, the program exits the decision point at YES and enters a processing function LET "INFO"=300'S. This informs the program that the decades data value lies in the group of 300's indicators shown in FIG. 3. Next, the program enters a processing function A=289; B=280 to set the value of the variables A and B. As will be discussed, the variables A and B are utilized to determine the exact data value. The program then enters the processing function STORE ALL 200'S which includes instructions for storing the values of all LED indicators which fall into the 200's group shown in FIG. 3.

If the data is not greater than 279, the program exits the decision point IS DATA>279 at NO and enters a decision point IS DATA>189. If so, the data exits the decision point at YES and enters a processing function LET "INFO"=200'S to inform the program that the decades data value lies within the 200's group of indicators. The variables A and B are then set in accordance with the processing function A=199; B=190 before the program enters the processing function STORE ALL 100'S. The processing function STORE ALL 100'S is also entered from the function STORE ALL 200'S. The program will then store all the values of the LED indicators which fall into the 100's group shown in FIG. 3.

If the data is not greater than 189, the program exits the decision point IS DATA>189 at NO and enters a decision point IS DATA 99. If this is the case, the program will exit the decision point at YES and enter a processing function LET "INFO"=100'S which informs the microcomputer that the decades data value lies within the 100's group. The program then enters the processing function A=109; B=100 to set the A and B variables. After the A and B variables have been set, the program enters a processing function STORE ALL 10'S which function is also entered after the completion of the processing function STORE ALL 100'S. The program will then store the values of the indicators in the 10's group. If the data is not greater than 99, the program exits the decision point IS DATA>99 at NO and enters a processing function IS DATA>9. If the data is not greater than 9, the program exits the decision point at NO and enters a processing function UNITS=-DATA (FIG. 4b) wherein the UNITS value is set equal to the data value. If the data is greater than 9, the program exits the decision point IS DATA>9 at YES and enters a processing function LET "INFO"=10. This signals the program that the decades data value is within the 10's group of FIG. 3. The variables A and B are then set according to the processing function A=19; B=10.

Next, the program exits either the processing function A=19; B=10 or the processing function STORE ALL 10'S and enters a processing function X=X+1 (FIG. 4b) wherein the variable X is incremented by 1. The program then enters a decision point IS DATA A. If the data is greater than the variable A, the program exits the decision point at YES and enters a processing function A=A+10; B=B+10 to increase the values of A and B by a value of 10. The program returns to the processing function X=X+1 before it again checks to see whether the data value is greater than the newly calculated A value. This process will continue until the value of the variable A has been increased sufficiently to exceed the data value. At this time, the variable X will represent the number of indicators within the particular group which are less than or equal to the data value. The program will then exit the decision point IS DATA>A at NO and enter the processing function UNITS=DATA−B. At this time the variable B has a value equal to the largest decades indicator which is to be lit such that the UNITS value can be calculated by subtracting the B variable from the data value.

After the UNITS value has been determined by the DATA−B calculation, the program enters the decision point IS "INFO"=300'S. If this is the case, the program exits the decision point at YES and enters a processing function STORE 300'S. At this time, the program will store those indicators in the 300's group which are less than or equal to the data value. The number of indicators which fall into this category corresponds to the value of the variable X which has previously been set. If the "INFO" value is not equal to the 300's the program exits the decision point at NO and enters the decision point IS "INFO"=200'S. If so, the program exits the decision point at YES and enters a processing function STORE 200'S wherein the 200's indicators having a value less than or equal to the data value are stored. If the "INFO" value does not correspond to the 200's, the program exits the decision point at NO and enters the decision point IS "INFO"=100'S. If YES, the program enters the processing function STORE 100'S for storing those 100's indicators which are less than or equal to the data value. If "INFO" is not equal to the 100's, the program exits the decision point at NO and enters a processing function STORE 10'S to store the respective number of 10's indicators. At this point, the program will have stored all indicators which are equal to or less than the corresponding data value therein. The program then enters the processing function DISPLAY ROUTINE in which the appropriate enable signals are generated through the PIA 43 to light those LED's whose values have been stored by the control program. The program will then return to the circle START to reexecute the A/D routine.

One of the advantages of the microprocessor-based display device of the present invention is that the display device can readily be adapted to a variety of applications. For example, the above-discussed program is designed for use with the display device 21 of FIG. 2 having polarity indicators for indicating the polarity of the input signal. In applications where the display device 21 is to display the angular position of a rotating element, the polarity indicators are typically not required. In these instances, those instructions associated with controlling the polarity indicators can be deleted from the control program. In other cases, it may be desirous to modify the control program and utilize the polarity indicators as either clockwise or counterclockwise direction indicators.

Figure 5:
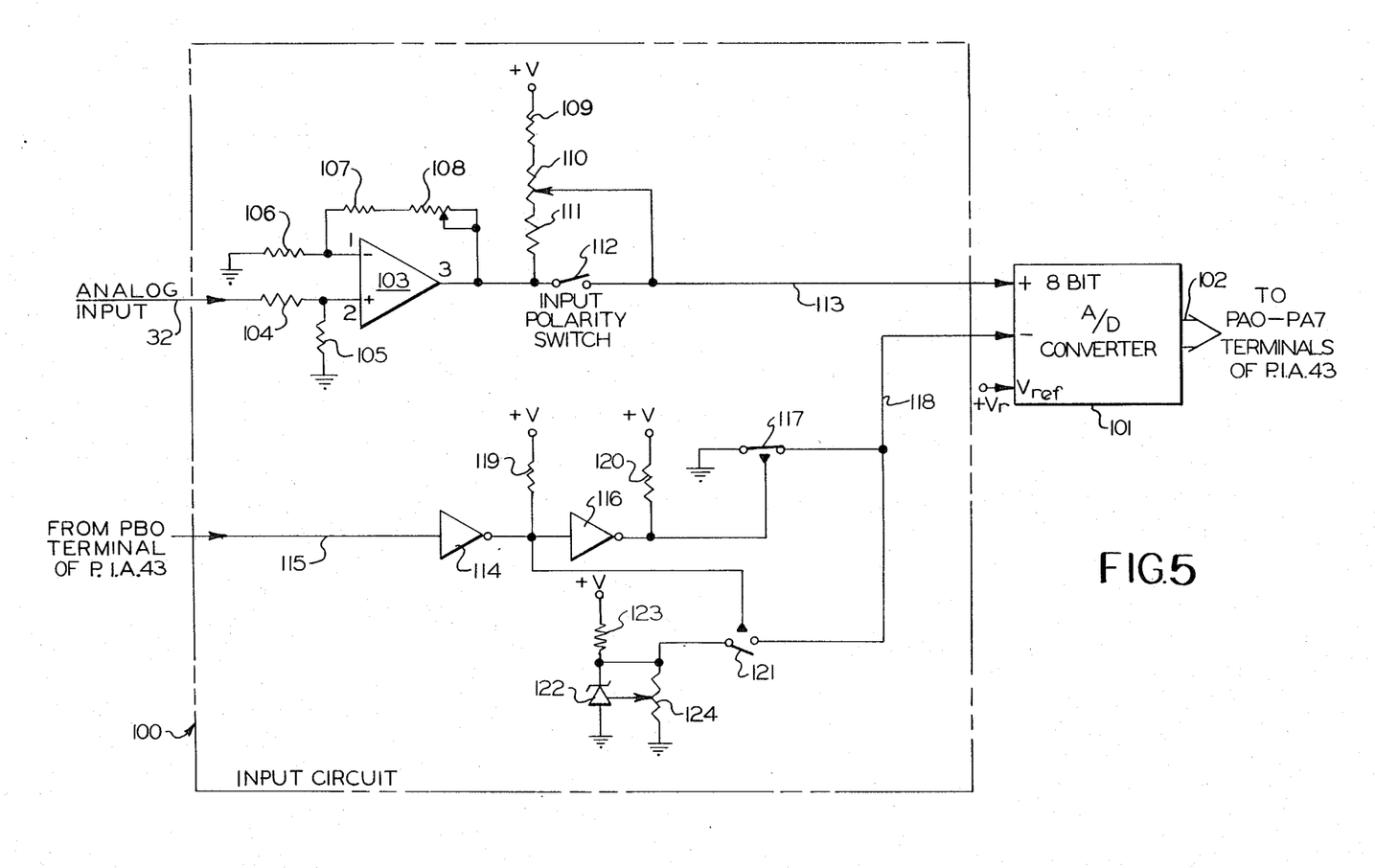
FIG. 5 is a schematic diagram of an alternate embodiment of the input circuit of FIG. 3.

There is shown in FIG. 5 an alternate embodiment 100 of the input circuit 31 of FIG. 3. Although not previously mentioned, the input circuit 31 of FIG. 3 is designed to operate in conjunction with an A/D converter having at least nine output lines. The nine bit output from the A/D converter 39 is supplied to the PA0 through PB0 terminals of the interface adapter 43. The nine output lines permit the converter 39 to have a output range from 0 to $2^9$ or 512. Thus, the input circuit 31, if utilized with a suitable A/D converter, can be used for either a display having a 359 unit range of the type shown in FIG. 2, or for a display having a 159 unit range of the type shown in FIG. 1.

In instances where the A/D converter used in the circuit 30 does not have at least nine output lines, the alternate embodiment circuit 100 of FIG. 5 can be utilized to increase the effective output range of the converter. In FIG. 5, an eight bit A/D converter 101 is connected to receive a differential input from the input circuit 100. The eight bit output from the converter 101 is supplied to the PA0 through PA7 terminals of PIA 43 on lines 102.

The input circuit 100 includes an operational amplifier 103 having non-inverting input 103-2 connected to receive the analog input signal on the line 32 through a resistor 104. A resistor 105 is connected between the non-inverting input 103-2 and the circuit ground potential. The inverting input 103-1 is connected to the ground potential through a resistor 106. A resistor 107 and a potentiometer 108 are connected in series between the inverting input 103-1 and the amplifier output 103-3. The variable terminal of the potentiometer 108 is also connected to the output 103-3. The potentiometer 108 is utilized to set the gain of the amplifier 103 in order to scale the input signal to a level suitable for conversion by the A/D converter 101. A resistor 109, a potentiometer 110, and another resistor 111 are connected in series between the +V power supply and the amplifier output 103-3. An input polarity switch 112 is connected between the output 103-3 and an output line 113. The variable terminal of the potentiometer 110 is also connected to the output line 113. The line 113 is connected to the non-inverting input of the A/D converter 101.

The input polarity switch 112 is normally closed when the expected range of analog input signals on the line 32 is of a positive polarity. In instances where at least a portion the analog input signals on the line 32 are of a negative polarity, the input polarity switch 112 is opened and the potentiometer 110 is adjusted to offset the negative signal at the amplifier output 103-3 such that the signal on the line 113 supplied to the A/D converter 101 will have a positive polarity.

The circuitry shown in the lower portion of the input circuit box 100 is utilized to increase the effective output range of the A/D converter 101. This portion of the circuit includes an inverter 114 which receives a range enable signal on a line 115 from the PB0 terminal of the PIA 43. The output of the inverter 114 is connected to the input of another inverter 116 having an output connected to the control input of an analog switch 117. The switch 117 is connected between the circuit ground potential and the line 118 which is connected to the inverting input of the A/D converter 101. The outputs of the inverters 114 and 116 are connected to the +V power supply through resistors 119 and 120, respectively.

The output of the inverter 114 is also connected to a control input of a second analog switch 121 having one terminal connected to the output of a constant voltage source 122 and the other terminal connected to the line 118. The constant voltage source has an output terminal connected to the +V power supply through a resistor 123 and a ground terminal connected to the circuit ground potential. A potentiometer 124 has its fixed terminals connected between the output and the ground terminals of the voltage source 122 and its variable terminal connected to the control input of the voltage source 122.

When the control signal to either of the analog switches 117 or 121 is at logic "1", the respective switch will be closed. Since the control signal to the switch 117 is supplied from the output side of the inverter 116 and the control signal supplied to the switch 121 is on the input side of the inverter 116, the switches 117 and 121 will always be in opposite positions.

The switches 117 and 121 function to control the voltage which is supplied to the inverting input of the A/D converter 101. Normally, the input circuit receives a logic "1" on the line 115. This produces a logic "0" at the output of the inverter 114 to open the switch 121 and a logic "1" at the output of the inverter 116 to close the switch 117. A ground potential is then supplied through the switch 117 to the inverting input of the A/D converter 101. The A/D converter 101 generates a digital output signal proportional to the difference between the non-inverting and the inverting input signals. The gain of the A/D converter 101 is controlled by the +Vr potential connected to the Vref input of the converter 101.

When the analog signal on the line 113 reaches a predetermined value, the digital output lines of the A/D converter 101 will all be at logic "1" which represents the upper limit of the converter 101. Since the A/D converter 101 has eight output lines, this permits an output range from 0 to $2^8$ or 256 units. Although such a range is suitable for controlling the display device of FIG. 1, which requires a range of 159 units, it cannot be used to control the display device of FIG. 2, which requires a range of 359 units.

In order to utilize an eight bit A/D converter with the display device of FIG. 2, the present invention provides a means for switching the voltage reference signals supplied to the inverting input of the A/D converter. When the output of the A/D converter reaches its upper limit such that all output lines are at logic "1", the microprocessor 42 will generate a logic "0" at the PB0 terminal of the PIA 43 on the line 115 to open the switch 117 and close the switch 121. This supplies the voltage generated by the constant voltage source 122 to the line 118 and the inverting input of the converter 101. The potentiometer 124 is adjusted such that the voltage generated by the constant voltage source 122 corresponds to the predetermined minimum analog voltage on the line 113 which causes the converter 101 to generate an output signal consisting of all logic "1's". At this time, the output of the A/D converter will represent the amount the voltage on the line 113 is above the predetermined reference voltage on the line 118. The microprocessor can combine the predetermined voltage amount with the reading of the A/D converter to obtain the actual value of the voltage on the line 113.

In summary, the input circuit 100 functions to expand the range of the output of the eight bit A/D converter 101 an extra bit such that the circuit has an output range of $2^9$ or 512 units. Consequently, such a circuit can be utilized to control a display device of the type shown in FIG. 2, which requires a range of 359 units.

In accordance with the provisions of the patent of statutes, the principle and mode of operation of the invention have been explained and illustrated in its preferred embodiment. However, it must be understood that the invention may be practiced otherwise than as specifically illustrated and described without departing from its spirit or scope.

What is claimed is:

1. A method of indicating a quantity of electrical information represented by an input signal having a value proportional to the quantity to be indicated comprising the steps of:
   a. generating a plurality of reference signals each having a different value;
   b. individually comparing the value of the input signal with each of said reference signals in a predetermined order until the value of the input signal falls between the values of two consecutive ones of said reference signals;
   c. storing a plurality of first indicating signals corresponding to each of said reference signals having values equal to and less than the value of the lesser one of said two consecutive reference signals in step (b);
   d. subtracting the value of said lesser one of said two consecutive reference signals in step (b) from the value of the input signal and storing at least one second indicating signal representing the value of the difference; and
   e. generating an indication of the quantity of electrical information represented by the input signal in response to said first and second stored indicating signals.

* * * * *